(12) United States Patent
Matsumura

(10) Patent No.: US 9,614,535 B2
(45) Date of Patent: Apr. 4, 2017

(54) PLL CIRCUIT, METHOD, AND ELECTRONIC APPARATUS

(71) Applicant: FUJITSU LIMITED, Kawasaki-shi, Kanagawa (JP)

(72) Inventor: Hiroshi Matsumura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/816,597

(22) Filed: Aug. 3, 2015

(65) Prior Publication Data

US 2016/0065226 A1 Mar. 3, 2016

(30) Foreign Application Priority Data

Aug. 27, 2014 (JP) ................................ 2014-172919

(51) Int. Cl.
*H03L 7/06* (2006.01)
*H03L 7/085* (2006.01)
*G01S 13/93* (2006.01)
*H03L 7/18* (2006.01)

(52) U.S. Cl.
CPC ............ *H03L 7/085* (2013.01); *G01S 13/931* (2013.01); *H03L 7/18* (2013.01)

(58) Field of Classification Search
None
See application file for complete search history.

(56) References Cited

U.S. PATENT DOCUMENTS

| 2013/0147531 | A1* | 6/2013 | Lee | H03L 7/085 327/158 |
| 2014/0285238 | A1* | 9/2014 | Matsumura | H03L 7/085 327/9 |
| 2014/0361817 | A1* | 12/2014 | Jovenin | H03L 7/08 327/156 |
| 2015/0222418 | A1* | 8/2015 | Akita | H03L 7/087 375/355 |
| 2015/0372682 | A1* | 12/2015 | Alexeyev | H03L 7/085 327/156 |
| 2016/0065226 | A1* | 3/2016 | Matsumura | H03L 7/085 327/158 |

FOREIGN PATENT DOCUMENTS

| JP | 05-308283 | 11/1993 |
| JP | 2011-119903 | 6/2011 |

* cited by examiner

Primary Examiner — Lincoln Donovan
Assistant Examiner — Khareem E Almo
(74) Attorney, Agent, or Firm — Fujitsu Patent Center

(57) ABSTRACT

A PLL circuit includes a frequency divider dividing an oscillation signal to generate a divided signal having a cycle of T/M (M: an integer greater than one); a phase comparator generating M reference signals by sequentially delaying a reference signal having a cycle of T one after another by a predetermined delay time and generating an Exclusive OR calculation result of the M reference signals and the divided signal; a loop filter generating a voltage signal based on the Exclusive OR calculation result input thereto; a voltage-controlled oscillator generating the oscillation signal by oscillating at a frequency in accordance with the voltage signal; and a control circuit adjusting the predetermined delay time to be equal to T/2M based on an Exclusive OR calculation result of at least two of the M reference signals.

11 Claims, 13 Drawing Sheets

PLL CIRCUIT, METHOD, AND ELECTRONIC APPARATUS

CROSS-REFERENCE TO RELATED APPLICATION

This application is based upon and claims the benefit of priority of the prior Japanese Patent Application No. 2014-172919, filed on Aug. 27, 2014, the entire contents of which are incorporated herein by reference.

FIELD

The embodiment discussed herein is related to a PLL circuit, a method of controlling the PLL circuit, and an electronic apparatus.

BACKGROUND

The phase noise characteristics of a signal generated by a Phase Locked Loop (PLL) circuit are used as an index indicating the purity of the signal. The phase noise of the PLL circuit is the characteristic that influences the performance of the radio apparatus using the PLL circuit therein, so that the phase noise of the PLL circuit is an important performance index for the PLL circuit.

The PLL circuit generally includes a phase comparator, a loop filter, a voltage-controlled oscillator (VCO), and a frequency divider. The frequency divider divides the frequency of the oscillation signal output from the VCO into 1/N frequency, and outputs the divided signal (frequency divided signal). The phase comparator compares the phases between the reference signal from the reference oscillator and the divided signal, and outputs the signal indicating the phase comparison result. The loop filter integrates the signal indicating the phase comparison result, and supplies a voltage signal having a voltage level corresponding to the integration result to the VCO. The VCO oscillates at the frequency based on the voltage signal. In the case where the frequency difference between the reference signal and the divided signal becomes zero when the VCO oscillates based on the voltage signal generated by the loop filter, the voltage of the voltage signal converges to a constant voltage and the PLL circuit is in a locked state.

References are made to Japanese Laid-open Patent Publication Nos. 05-308283 and 2011-119903.

SUMMARY

According to an aspect of the present invention, a PLL circuit includes a frequency divider dividing an oscillation signal to generate a divided signal having a cycle of T/M (M: an integer greater than one); a phase comparator generating M reference signals by sequentially delaying a reference signal having a cycle of T one after another by a predetermined delay time and generating an Exclusive OR calculation result of the M reference signals and the divided signal; a loop filter generating a voltage signal based on the Exclusive OR calculation result input thereto; a voltage-controlled oscillator generating the oscillation signal by oscillating at a frequency in accordance with the voltage signal; and a control circuit adjusting the predetermined delay time to be equal to T/2M based on an Exclusive OR calculation result of at least two of the M reference signals.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENT

Figure 1:
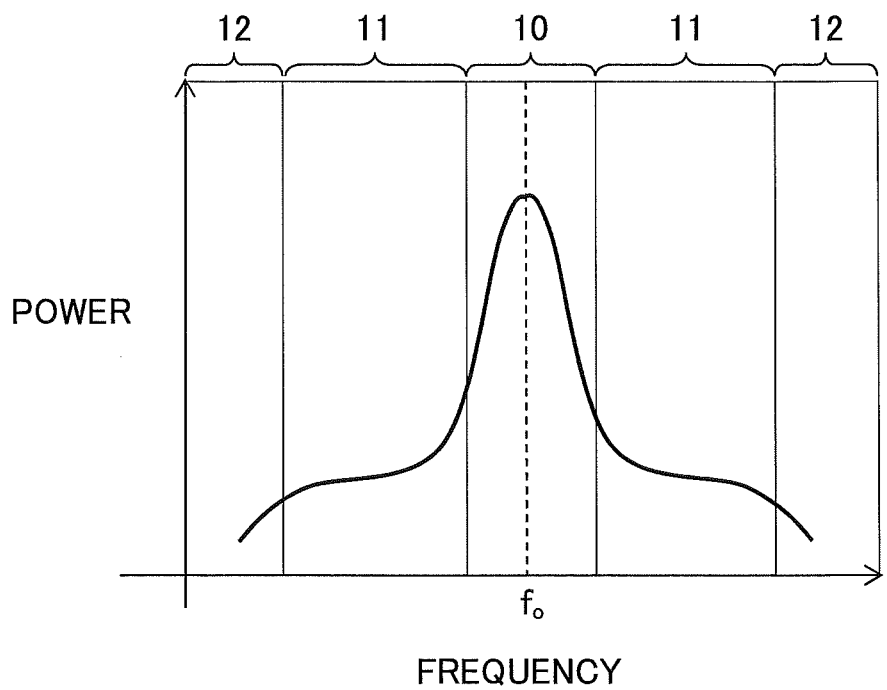
FIG. 1 illustrates typical phase noise characteristics of a PLL circuit.

FIG. 1 illustrates typical phase noise characteristics in a PLL circuit. In the figure, the horizontal axis indicates frequency and the vertical axis indicates power of phase noise. The frequency "$f_0$" is the oscillation frequency of the PLL circuit. The phase noise of the PLL circuit can be classified into the phase noise of the area 10, the phase noise of the area 11, and the phase noise of the area 12. As the phase noise of the area 10, the phase noise of the reference oscillator is dominant. As the phase noise of the area 11, the phase noise of the phase comparator is dominant. As the phase noise of the area 12, the phase noise of the VCO is dominant. Here, those phase noises occur mainly caused by thermal noise of resistors, fluctuations of the current flowing through active devices, etc.

Among those phase noises, the phase noise of the area 11 largely influences the performance of the radio apparatus. Theoretically, the phase noise "$S_{PLL}$" of the area 11 can be expressed by the following Formula (1).

$$S_{PLL} \approx S_{PD}/K_d^2 \cdot N^2 \qquad \text{Formula (1)}$$

Here, the "$S_{PD}$" denotes the output noise of the phase comparator, the "$K_d$" denotes the gain of the phase comparator, and the "N" denotes the frequency division ratio of the frequency divider. As described, those three factors mainly determine the phase noise of the area 11. According to Formula (1), it is understood that by reducing the frequency division ratio "N", the phase noise of the area 11 can be reduced.

In a general-purpose PLL circuit, the frequency of the reference signal and the frequency of the divided signal are set to be equal to each other. On the other hand, in order to reduce the phase noise by reducing the frequency division ratio "N", there is a technique in which plural (M) phase comparators are arranged in parallel so that the frequency division ratio "N" can be reduced to 1/M. In this technique, when the frequency division ratio is set to "N/M", the phase noise can be reduced by $1/M^2$ times.

However, when the plural (M) phase comparators are arranged in parallel, the circuit area and energy consumption are increased accordingly. Further, in this case, plural (M) reference signals are generated to compare plural (M) phases. Due to this, the spurious characteristics of the PLL circuit may be degraded depending on the accuracies between the plural reference signals.

In light of the above problem, it is desired to provide a PLL circuit having good characteristics of the phase noise with a simple circuit configuration.

According at least one embodiment of the present invention, it becomes possible to provide a PLL circuit having good characteristics of the phase noise with a simple circuit configuration.

In the following, embodiments of the present invention are described in detail with reference to the accompanying drawings.

Figure 2:
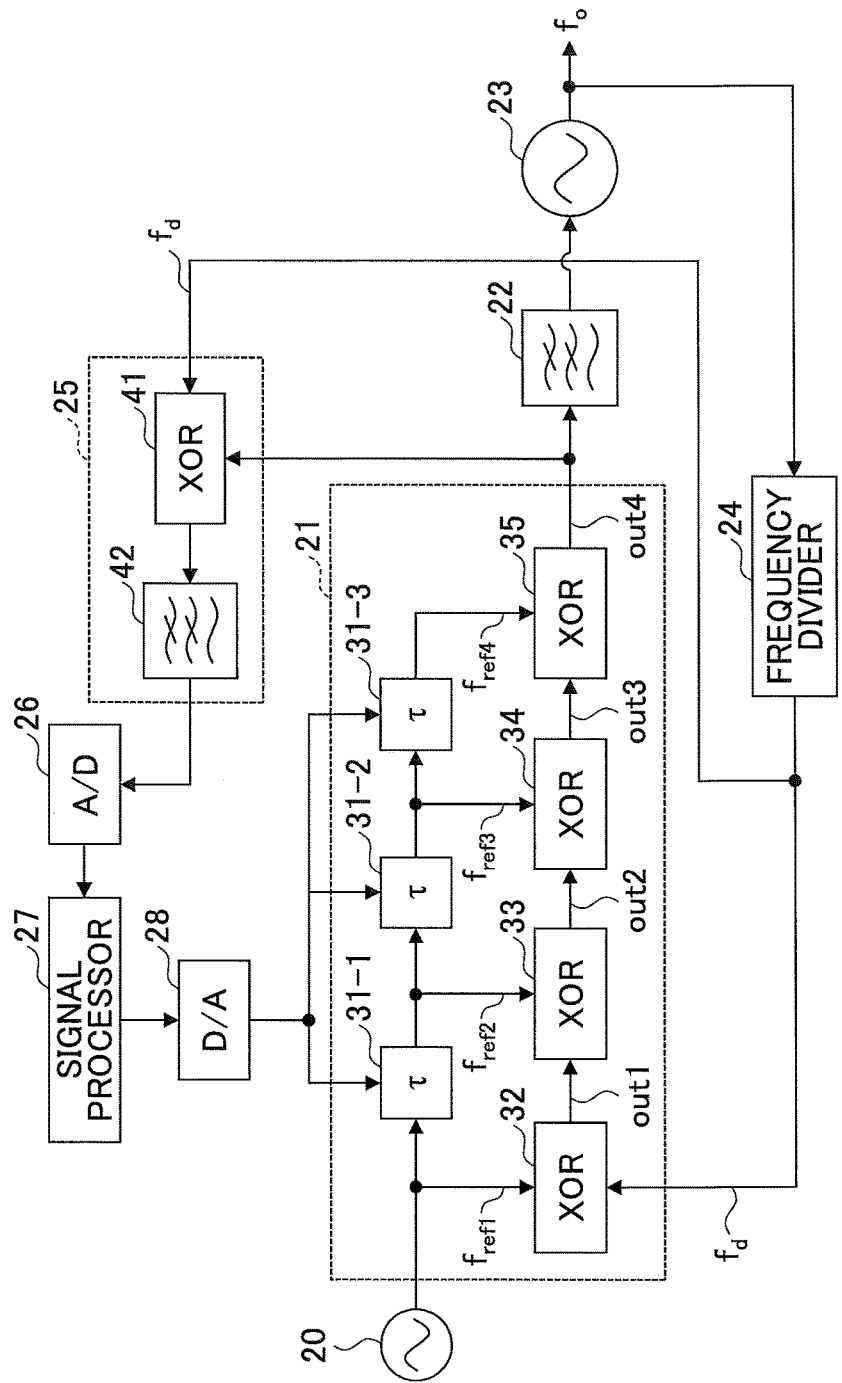
FIG. 2 illustrates an example configuration of a PLL circuit according to an embodiment.

FIG. 2 illustrates an example configuration of a PLL circuit according to an embodiment. The PLL circuit of FIG. 2 includes a reference oscillator 20, a phase comparator 21, a loop filter 22, a VCO 23, a frequency divider 24, a delay error detector 25, an AD converter 26, a signal processor 27, and a DA converter 28. In FIG. 2 and other figures similar to FIG. 2, note that a boundary between a circuit or functional block illustrated as a block and another circuit or functional block basically refers to a functional boundary, and may not correspond to any of physical positional separation, electrical signal separation, control theoretical separation, etc. Each circuit and functional block may be provided as a single hardware module which is physically separated from any other blocks to some extent, or may indicate one function integrated in a single hardware module which physically includes any other block as well.

The frequency divider 24 divides an oscillation signal output from the VCO 23, and generates a divided signal (frequency-divided signal) "$f_d$". The phase comparator 21 compares the phases between a reference signal "$f_{ref1}$" from the reference oscillator 20 and the divided signal "$f_d$", and outputs a signal "out4" indicating the phase comparison result (e.g., a signal based on the phase difference). The loop filter 22 integrates the signal "out4" indicating the phase comparison result, and supplies a voltage signal having a voltage level corresponding to the integration result. The VCO 23 oscillates at the frequency based on the voltage signal from the loop filter 22. In a case where the phase difference between the reference signal "$f_{ref1}$" and the divided signal "$f_d$" becomes zero when the VCO 23 oscillates based on the voltage signal generated by the loop filter 22, the voltage of the voltage signal converges to a constant voltage and the PLL circuit is in a locked state.

More specifically, the frequency divider 24 performs frequency division on the oscillation signal from the VCO 23, and generates the divided signal "$f_d$" having a cycle of T/M. Here, "M" is an integer greater than one. In this example, it is assumed that "M" is four (M=4). Further, "T" refers to a cycle of the reference signal "$f_{ref1}$" oscillated by the reference oscillator 20. The phase comparator 21 generates M reference signals "$f_{ref1}$" through "$f_{ref4}$", in which the reference signal "$f_{ref1}$" has a cycle of T, and the reference signals "$f_{ref2}$" through "$f_{ref4}$" are delayed from the reference signals "$f_{ref1}$" through "$f_{ref3}$", respectively, by a predetermined delay time. Further, the phase comparator 21 generates the Exclusive OR of the M reference signals "$f_{ref1}$" through "$f_{ref4}$" and the divided signal "$f_d$", and outputs the Exclusive OR as the phase comparison result. As described, the loop filter 22 inputs the phase comparison result, and generates the voltage signal. Further, by oscillation based on the voltage signal, the VCO 23 generates the oscillation signal.

The phase comparator 21 includes variable delay circuits 31-1 through 31-3, and exclusive OR (XOR) circuits 32 through 35. The variable delay circuits 31-1 through 31-3 generate the (M−1) reference signals "$f_{ref2}$" through "$f_{ref4}$", respectively, by sequentially delaying the reference signal "$f_{ref1}$" having the cycle of T by the predetermined delay time. Ideally, the predetermined delay time is equal to T/2M.

As illustrated in FIG. 2, the phase comparator 21 includes the M (e.g., 4 in this example) two-input XOR circuits connected in series. Among those XOR circuits, the first-stage XOR circuit 32 calculates the XOR result of (between) two signals selected from a group consisting of the M reference signals "$f_{ref1}$" through "$f_{ref4}$" and the divided signal "$f_d$". In this example, the XOR (result) of the reference signal "$f_{ref1}$" and the divided signal "$f_d$" is calculated. Each of the XOR circuits 33 through 35 calculates the XOR result of two signals, one of which is selected from the group consisting of the M reference signals "$f_{ref1}$" through "$f_{ref4}$" and the divided signal "$f_d$" and the other of which is the output from the previous-stage XOR circuit. In this example, the XOR circuits 33 through 35 calculate the XOR (results) of the reference signals "$f_{ref2}$" through "$f_{ref4}$" and the previous-stage XOR circuits 32 through 34, respectively.

The result of the Exclusive OR (XOR) operation relative to M+1 (M+1-bit) inputs becomes 1 when the number of bits having a value 1 among input bits is an odd number. On the other hand, the result of the XOR operation relative to M+1 (M+1-bit) inputs becomes 0 when the number of bits having a value 1 among input bits is an even number. This XOR operation can be calculated by a single XOR circuit having M+1 inputs, and by M two-input XOR circuits connected in cascade (in series). Therefore, the phase comparator 21 may calculate the XOR result, for example, by using a single XOR circuit having M+1 inputs or by using M two-input XOR circuits connected in cascade (in series). In this case, note that which input signal is applied to which of the M+1 input terminals does not influence the XOR result of the phase comparator 21. Accordingly, for example, the reference signals "$f_{ref1}$" and "$f_{ref2}$" may be applied to the two inputs of the XOR circuit 32. In this case, the reference signals "$f_{ref3}$" and "$f_{ref4}$" and the output from the previous-stage XOR circuits 32 and 33 may be applied to the two inputs of the XOR circuits 33 and 34, respectively. Further, the output from the previous-stage XOR circuit 34 and the divided signal "$f_d$" may be applied to the two inputs of the XOR circuit 35.

In the variable delay circuits 31-1 through 31-3, the delay time may differ from the desired (predetermined) delay time due to causes of process variation, power voltage fluctuation, temperature change, etc. The delay error detector 25, the AD converter 26, the signal processor 27, and the DA converter 28 collectively function as a control circuit which adjusts the delay time of the variable delay circuits 31-1 through 31-3 to be equal to T/2M based on an XOR result of at least two signals of the M reference signals. In the configuration of FIG. 2, the delay error detector 25 includes a two-input XOR circuit 41 and a low path filter 42. The two-input XOR circuit 41 calculates the XOR result between the signal "out4" indicating the XOR result (phase comparison result) generated by the phase comparator 21 and the divided signal "$f_d$" generated by the frequency divider 24. The output from the two-input XOR circuit 41 is smoothed by the low path filter 42. The AD converter 26 converts the analog voltage output from the low path filter 42 into a digital voltage value. The signal processor 27 converts the digital voltage value into another digital voltage value based on a predetermined relationship. The DA converter 28 converts the digital voltage value, which is generated by the signal processor 27, into an analog voltage, and applies the analog voltage to the variable delay circuits 31-1 through 31-3. Based on the feedback control described above, it becomes possible to adjust the predetermined delay time (i.e., the delay time of the variable delay circuits 31-1 through 31-3) to be equal to T/2M.

Here, calculation value of the XOR result "out4" is the XOR result of M+1 (5) signals which are the M (4) reference signals "$f_{ref1}$" through "$f_{ref4}$" and the divided signal "$f_d$". In the calculation of the XOR result "out4", one divided signal "$f_d$" is included (used). Therefore, in the calculation between the XOR result "out4" and the divided signal "$f_d$", two divided signals "$f_d$" are included. The XOR result between the two divided signals "$f_d$" always becomes zero. Thus, the XOR result between the XOR result "out4" and the divided signal "$f_d$" is equal to the XOR result between the M reference signals "$f_{ref1}$" through "$f_{ref4}$".

In order to calculate the XOR result between the M reference signals, it is desired to have a single XOR circuit having M+1 inputs or M two-input XOR circuits. By calculating the XOR result between the XOR result (phase comparison result) "out4" and the divided signal "$f_d$" by using the configuration of FIG. 2, it becomes possible to calculate the value which is equal to the XOR result between the M reference signals by using one two-input XOR circuit 41.

Figure 3:
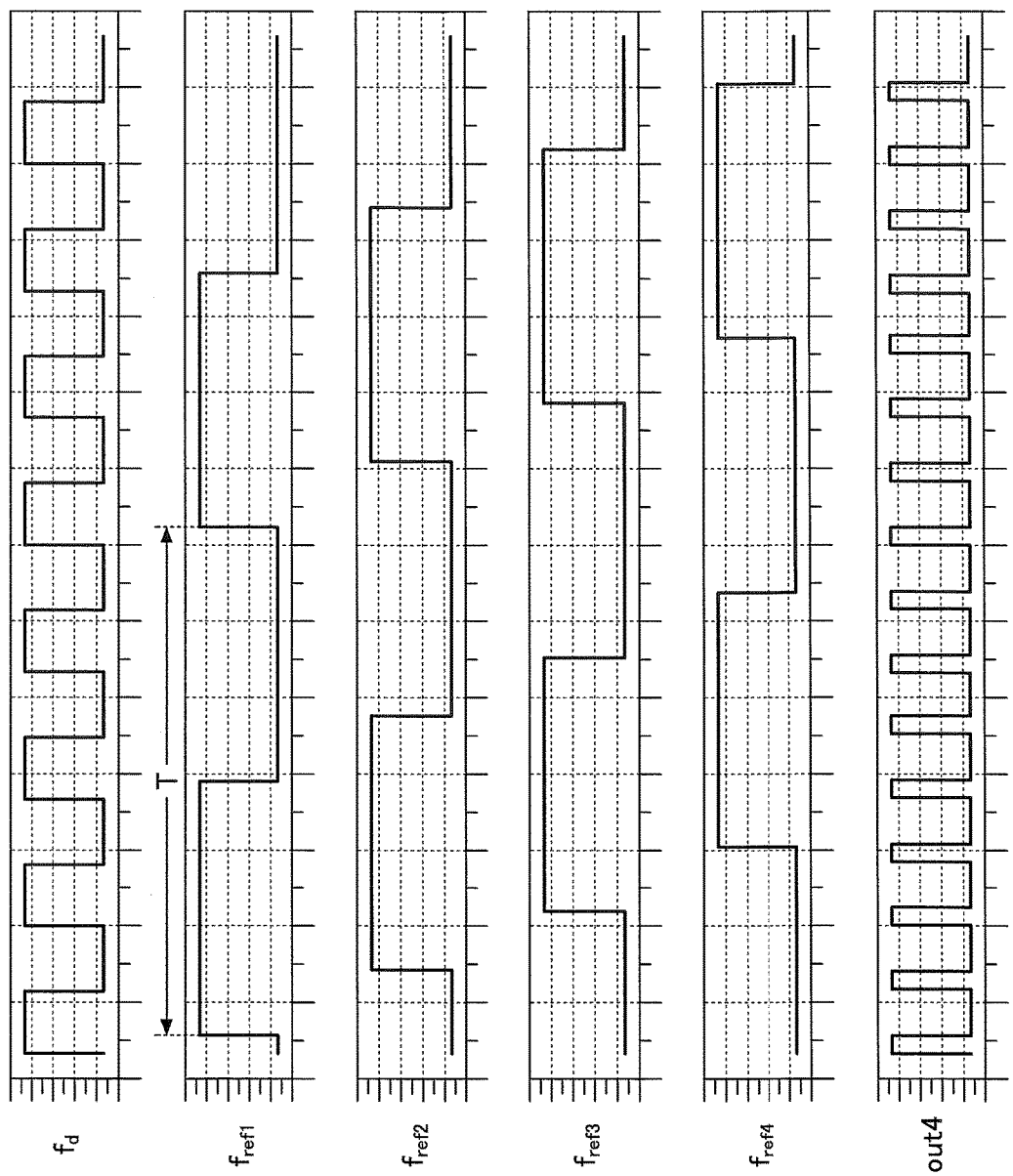
FIG. 3 is a timing chart illustrating an example of an Exclusive OR operation in a case where delay time differences between reference signals are ideal.

FIG. 3 is a timing chart illustrating an example of an Exclusive OR (XOR) operation in a case where the delay time difference between the reference signals is ideal. The output signal "out4" from the phase comparator 21 can be obtained by calculating the XOR result between five signals, which are one divided signal "$f_d$" having a cycle of T/M (T/4 in this example) and four reference signals "$f_{ref1}$" through "$f_{ref4}$" having a cycle of T. FIG. 3 illustrates a case where the reference signals "$f_{ref1}$" through "$f_{ref4}$" are ideally shifted one from another by the delay time T/2M (T/8 in the example). The output signal "out 4", which is the phase comparison result, indicates the phase differences between the rising and falling edges of the divided signal "$f_d$" and the edges of the corresponding reference signals. That is, the amounts of the phase differences correspond to the pulse widths of the pulses of the output signal "out 4".

When the difference between the edge timings (i.e., the phase difference between the edges) becomes greater, the corresponding pulse width of the output signal "out 4" becomes greater accordingly. On the other hand, when the difference between the edge timings (i.e., the phase difference between the edges) is reduced, the corresponding pulse width of the output signal "out 4" is reduced accordingly. Therefore, by smoothing the output signal "out 4" of FIG. 2, which is the phase comparison result of the phase comparator 21, by using the loop filter 22 and controlling the oscillation frequency of the VCO 23 in accordance with the output voltage of the loop filter 22, it becomes possible to lock the PLL circuit. That is, when the phase difference between the reference signal "$f_{ref1}$" and the divided signal "$f_d$" becomes zero, the output voltage signal of the loop filter 22 converges to a constant voltage, so that the PLL circuit is in a locked state.

Further, the XOR operation of FIG. 3 is equal to the XOR operation in which a first XOR result is calculated between the reference signals "$f_{ref1}$" through "$f_{ref4}$", and then the XOR result is calculated between the first XOR result and the divided signal "$f_d$". By calculating the first XOR result between the reference signals "$f_{ref1}$" through "$f_{ref4}$", a reference signal can be generated which has the same cycle (T/4) as that of the divided signal "$f_d$", four-times frequency of that of the reference signals, and the phases of the reference signals "$f_{ref1}$" through "$f_{ref4}$". Then, by calculating the XOR result between the reference signal (having a cycle of T/4) having four-time frequency and the divided signal "$f_d$" (having a cycle of T/4), the phase difference result is obtained (calculated).

In the above PLL circuit, the ratio of the cycle of the reference signals "$f_{ref1}$" through "$f_{ref4}$" to the cycle of the divided signal "$f_d$" is 1:1/M. That is, when compared with the case where the ratio of the cycle of the reference signals to the cycle of the divided signal is 1:1, in the PLL circuit of FIG. 2, the cycle of the divided signal "$f_d$" is relatively short (the frequency is relatively high). In other words, when compared with a usual PLL circuit, the frequency division ratio of the frequency divider 24 in FIG. 2 is smaller.

The output signal of the phase comparator includes the phase noise which is generated by the phase comparator. In this case, as illustrated in Formula (1), the phase noise, which presents in the output oscillation signal of the PLL circuit caused by the phase noise, is proportional to the square of the frequency division ratio "N". In this regard, by reducing the frequency division ratio "N", it becomes possible to reduce the phase noise which presents in the output oscillation signal of the PLL circuit. In the following, more details are described. In the PLL circuit of FIG. 2, by arranging M (4 in this example) phase comparators (XOR circuits), it becomes possible to reduce the frequency division ratio of the frequency divider 24 (by 1/M times). Here, it is assumed that the frequency division ratio, which is reduced as described above, is "N0/M". Generally, a feedback gain by the frequency divider having the frequency division ratio "N0/M" is "M/N0", which is M times greater than the gain "1/N0" which is before the frequency division ratio is reduced. When the feedback gain is increased by M times, the feedback amount is amplified by M times. Thus, the amount of contribution of the noise after the feedback is given is reduced by 1/M times. That is, the contribution of the phase comparator noise to the PLL phase noise is reduced by 1/M times.

Further, the phase noise generated by the phase comparator is mainly caused by the thermal noise, the shot noise, and the flicker noise of the transistor of the output final stage. Accordingly, the phase noise generated by the phase comparator having plural XOR circuits connected in series does not substantially differ from the phase noise generated by the phase comparator having one (stage of) XOR circuit. Therefore, the effect of reducing the phase noise by the circuit configuration of FIG. 2 is remarkably large.

Further, in the circuit configuration of FIG. 2, in order to obtain (calculate) the phase comparison result by the phase comparator 21, it is only desired to calculate XOR results by the XOR circuits. Therefore, according to an embodiment, it becomes possible to provide a PLL circuit having a low phase noise with a relatively simple configuration without necessity to mount plural phase comparators in a related art technology.

Figure 4:
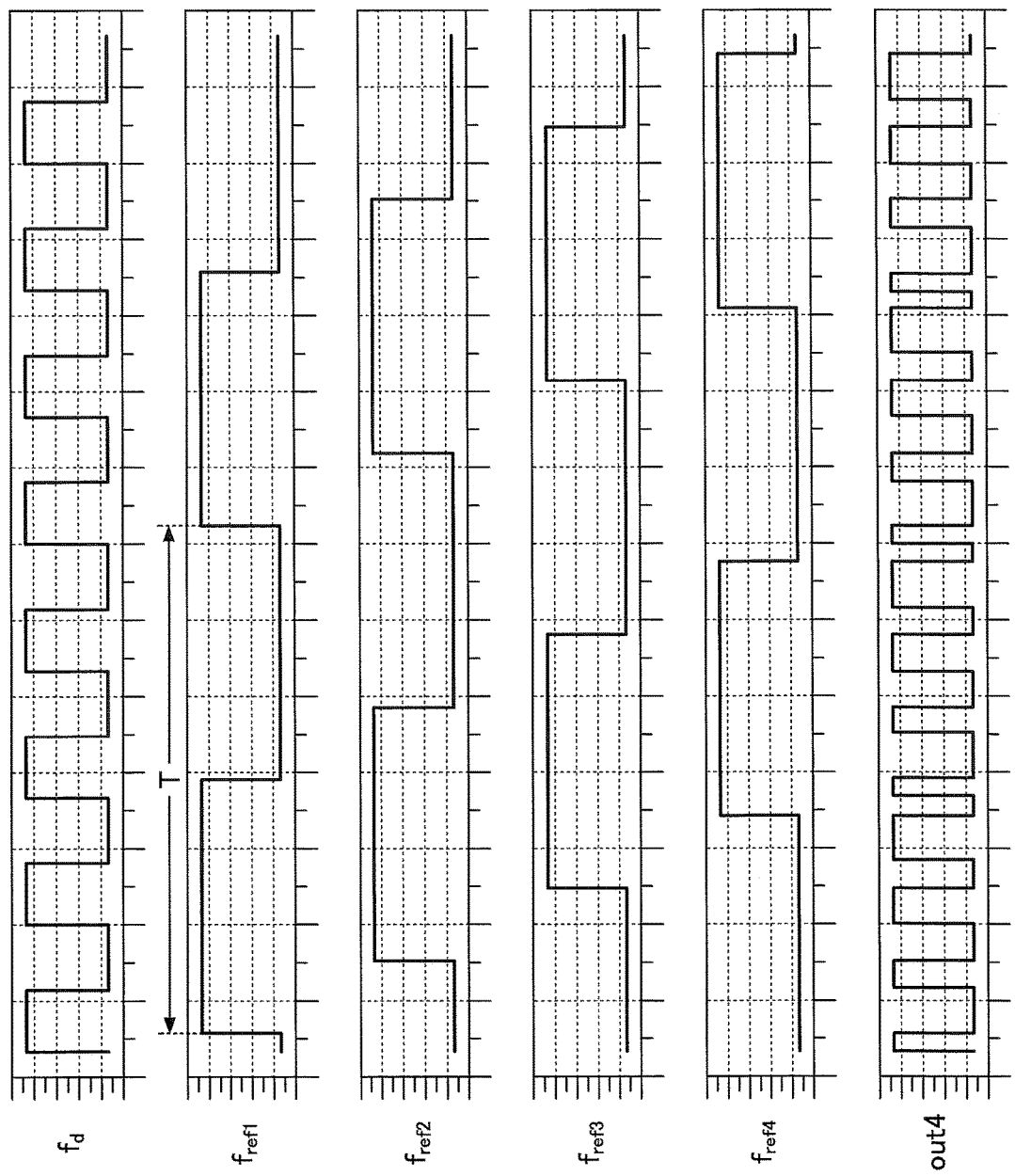
FIG. 4 is a timing chart illustrating an example of the Exclusive OR operation in a case where the delay time differences between the reference signals differ from an ideal value.

FIG. 4 is a timing chart illustrating an example of an Exclusive OR (XOR) operation in a case where the delay time difference between the reference signals is shifted from the ideal value. The output signal "out4" of the phase comparator 21 is obtained by calculating the XOR result between five signals, which are the divided signal "$f_d$" having a cycle of T/M (T/4 in this example) and the reference signals "$f_{ref1}$" through "$f_{ref4}$" having a cycle of T.

In the variable delay circuits 31-1 through 31-3, the delay time may differ from the desired delay time due to causes of process variation, power voltage fluctuation, temperature change, etc. In FIG. 4, the time difference between the reference signals "$f_{ref1}$" and the reference signal "$f_{ref4}$", that is, the time difference between the reference signal "$f_{ref1}$" and the reference signal "$f_{ref2}$", time difference between the reference signal "$f_{ref2}$" and the reference signal "$f_{ref3}$", and time difference between the reference signal "$f_{ref3}$" and the reference signal "$f_{ref4}$", is longer than T/2M (T/8 in this example). In this case, even when the phase difference between the divided signal "$f_d$" and the reference signal "$f_{ref2}$" is the same as that in FIG. 3, the average of the pulse widths of the output signal "out4", which is the phase comparison result, becomes greater than the average of the pulse width of the output signal "out4" in FIG. 3. Further, the operation is repeated in which the pulse width is gradually increased.

As described, in the case where the delay time difference between the reference signals differs from the ideal value, the pulse widths in the output signal "out4", which indicates the phase comparison result, differ from the pulse width which is desired. As a result, the characteristics of the PLL circuit may be degraded. More specifically, a low-frequency spurious component may be present, which degrades the spurious characteristics of the PLL circuit.

In light of the above point, the PLL circuit of FIG. 2 includes a control circuit (i.e., the delay error detector 25, the AD converter 26, the signal processor 27, and the DA converter 28) to adjust the delay time (delay time difference) by feedback control. By the feedback control by the control circuit, it becomes possible to adjust the delay time to be equal to T/2M based on the XOR result of at least two reference signals among the M reference signals.

Figure 5:
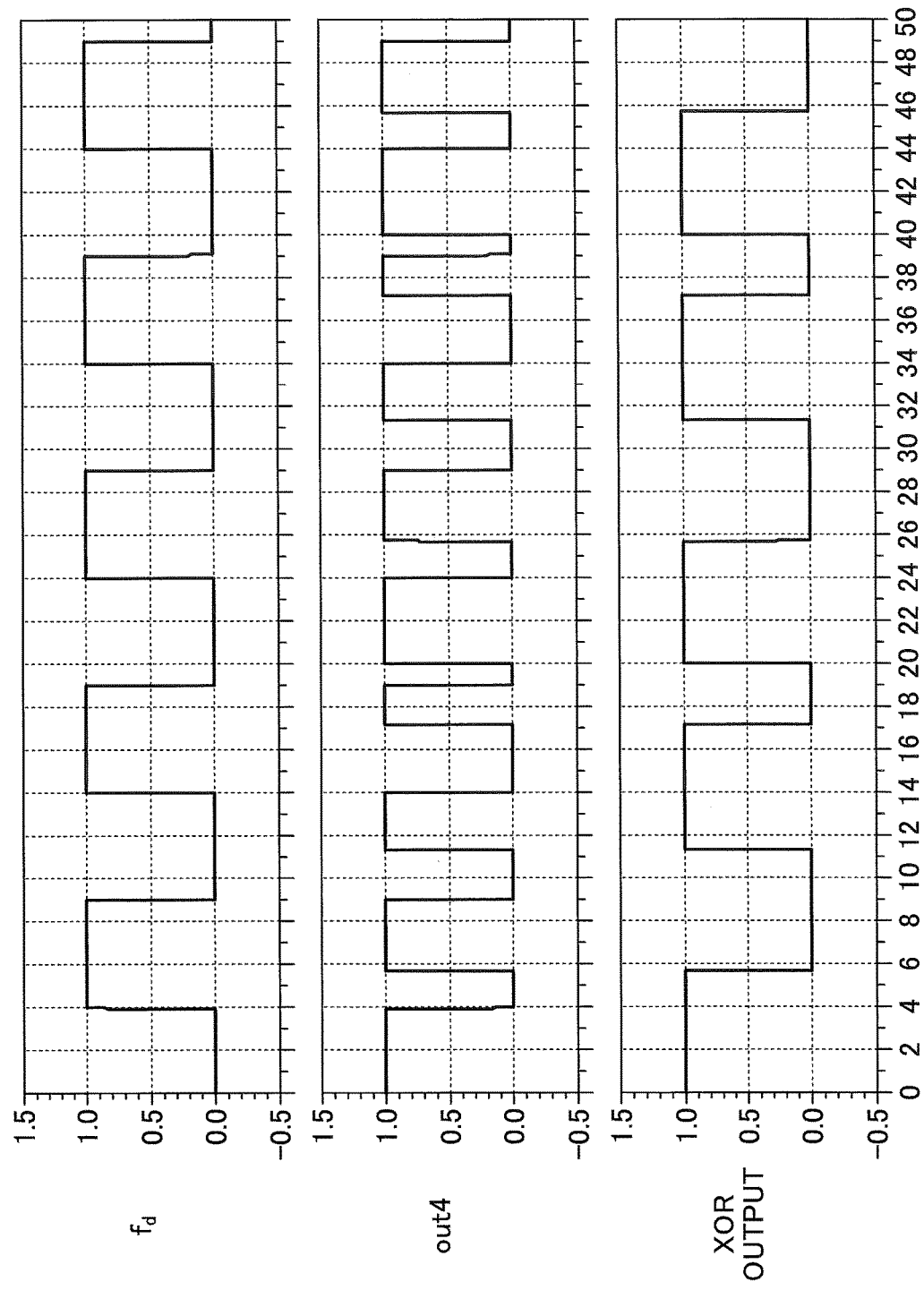
FIG. 5 is a timing chart illustrating an example of the Exclusive OR operation in a case where the delay time differences between the reference signals are longer than the ideal value.

FIG. 5 is a timing chart illustrating an example of an Exclusive OR (XOR) operation in a case where the delay time difference between the reference signals is longer than the ideal value. The output signal "out4" of the phase comparator 21 is obtained by calculating the XOR result between five signals, which are the divided signal "$f_d$" having a cycle of T/M (T/4 in this example) and the reference signals "$f_{ref1}$" through "$f_{ref4}$" having a cycle of T. The two-input XOR circuit 41 of FIG. 2 generates the "XOR output" waveform, which is illustrated in the bottom of FIG. 5, by calculating the XOR result between the output signal "out4" and the divided signal "$f_d$". As described above, when two divided signals "$f_d$" are cancelled by each other, the "XOR output" becomes equal to the XOR result of the four reference signals "$f_{ref1}$" through "$f_{ref4}$".

In a case where the delay time difference between the reference signals is the ideal value "T/2M ("T/8" in this example)", the XOR result of the reference signals "$f_{ref1}$" through "$f_{ref4}$" is obtained as a pulse signal having a cycle of T/4 and a duty ratio of 50%. When the delay time difference between the reference signals "$f_{ref1}$" through "$f_{ref4}$" is gradually longer than the ideal value "T/2M ("T/8" in this example)", the pulse width of the XOR result is gradually increased. FIG. 5 illustrates the case where the pulse width of the "XOR output" is increased as such. Further, when the delay time difference between the reference signals "$f_{ref1}$" through "$f_{ref4}$" exceeds a certain value, the pulse width of the "XOR output" starts decreasing.

Figure 6:
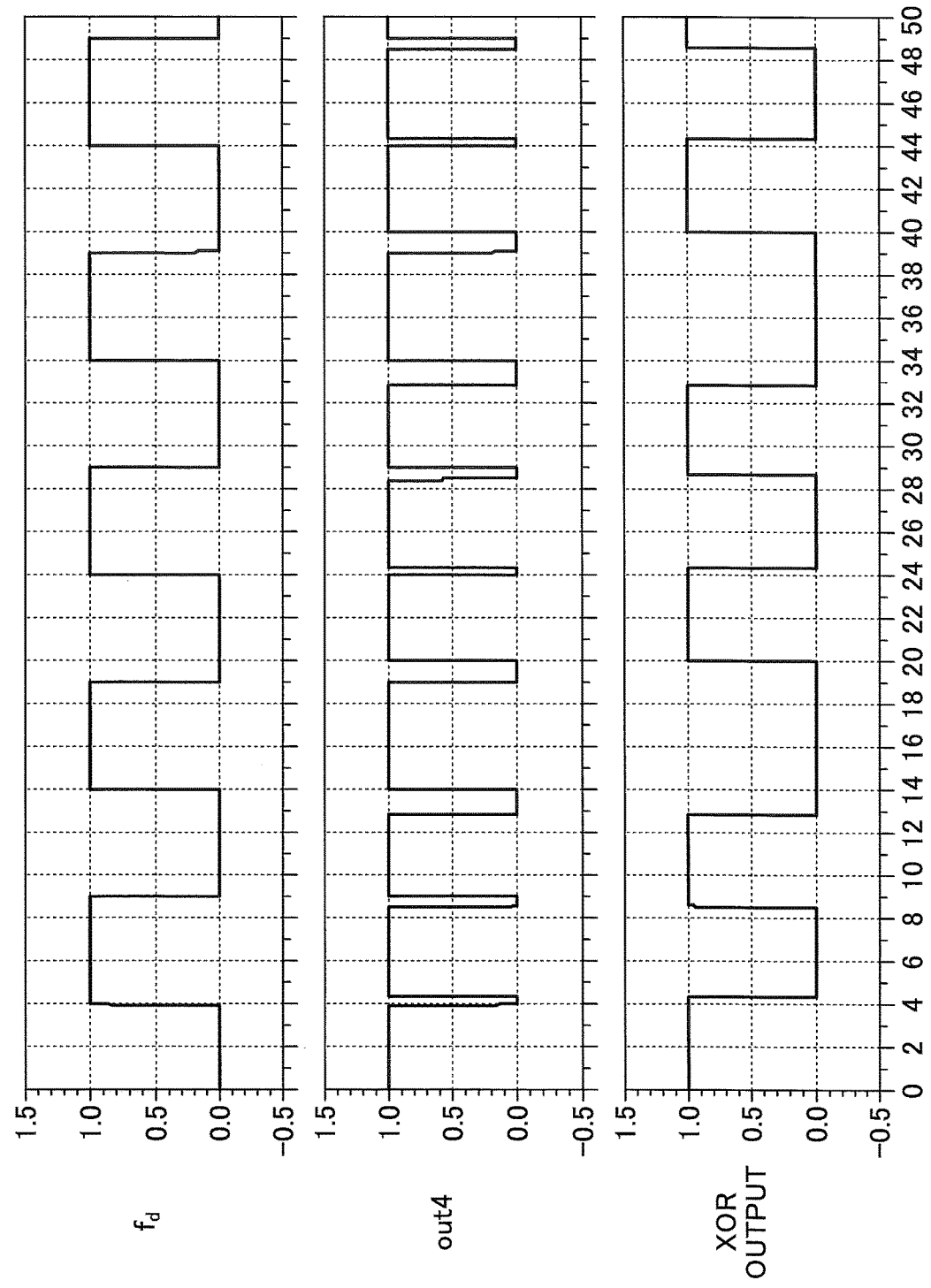
FIG. 6 is a timing chart illustrating an example of the Exclusive OR operation in a case where the delay time differences between the reference signals are shorter than the ideal value.

FIG. 6 is a timing chart illustrating an example of an Exclusive OR (XOR) operation in a case where the delay time difference between the reference signals is shorter than the ideal value. The "XOR output" waveform, which is illustrated in the bottom of FIG. 6, refers to the XOR result between the output signal "out4" from the phase comparator 21 and the divided signal "$f_d$". The "XOR output" becomes equal to the XOR result of the four reference signals "$f_{ref1}$" through "$f_{ref4}$".

In a case where the delay time difference between the reference signals is the ideal value "T/2M ("T/8" in this example)", the XOR result of the reference signals "$f_{ref1}$" through "$f_{ref4}$" is obtained as a pulse signal having a cycle of T/4 and a duty ratio of 50%. When the delay time difference between the reference signals "$f_{ref1}$" through "$f_{ref4}$" is gradually shorter than the ideal value "T/2M ("T/8" in this example)", the pulse width of the XOR result is gradually decreased. FIG. 6 illustrates the case where the pulse width of the "XOR output" is decreased as such. Further, when the delay time difference between the reference signals "$f_{ref1}$" through "$f_{ref4}$" becomes zero, the pulse width of the "XOR output" also becomes zero.

Figure 7:
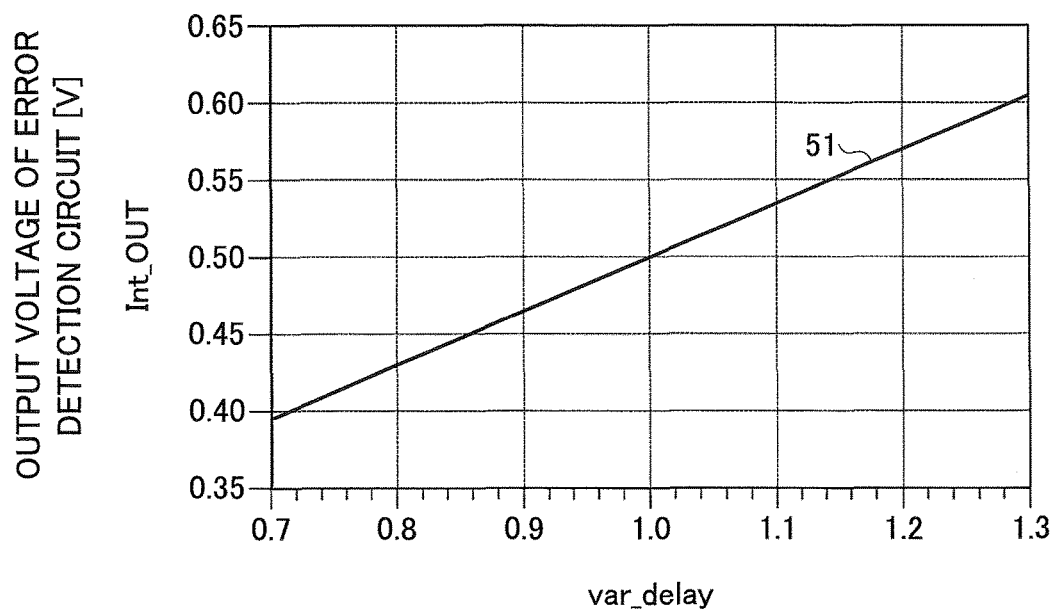
FIG. 7 is a graph illustrating an example relationship between a delay time of a variable delay circuit and an output voltage of an error detection circuit.

FIG. 7 is a graph illustrating the delay time of the variable delay circuits and the output voltage of a delay detection circuit (the delay error detector 25). In FIG. 7, the horizontal axis indicates the delay time "var_delay" of the variable delay circuits and the vertical axis indicates the output voltage "Int_XOUT" of the delay error detector 25. Here, the ideal value of the delay time "var_delay" is set to 1.0, and the actual delay time is indicated as the ratio of the actual delay time to the ideal delay time. The output voltage "Int_XOUT" refers to the output voltage of the low path filter 42 when it is assumed that the voltage levels of "HIGH" and "LOW" outputs of the two-input XOR circuit 41 are 1.0 and 0, respectively.

In FIG. 7, a characteristic straight line 51 indicates the output characteristics of the delay error detector 25. When the value of the delay time "var_delay" is 1.0, the value of the output voltage "Int_XOUT" indicated by the characteristic straight line 51 is 0.5. That is, in a case where the value of the delay time is ideal, as described above, the output of the two-input XOR circuit 41 is a pulse signal having the duty ratio of 50%. Accordingly, the output of the low path filter 42 acquired by smoothing the pulse signal is an intermediate (average) voltage which is between the HIGH voltage and LOW voltage. Further, for example, in a case where the value of the delay time "var_delay" is 1.2 which is longer than the ideal value, the output voltage value indicated by the characteristic straight line 51 is approximately 0.57. On the other hand, for example, in a case where the value of the delay time "var_delay" is 0.8 which is shorter than the ideal value, the output voltage value indicated by the characteristic straight line 51 is approximately 0.43.

In accordance with the output voltage of the delay error detector 25 acquired as described above, by adjusting the delay value of the variable delay circuits 31-1 through 31-3 by the AD converter 26, the signal processor 27, and the DA converter 28, it becomes possible to bring the delay time close to the ideal value of T/2M. Specifically, when the output voltage of the delay error detector 25 is higher than 0.5, the delay amount of the variable delay circuits 31-1 through 31-3 is reduced (shortened). On the other hand, when the output voltage of the delay error detector 25 is lower than 0.5, the delay amount of the variable delay circuits 31-1 through 31-3 is increased (elongated).

Figure 8:
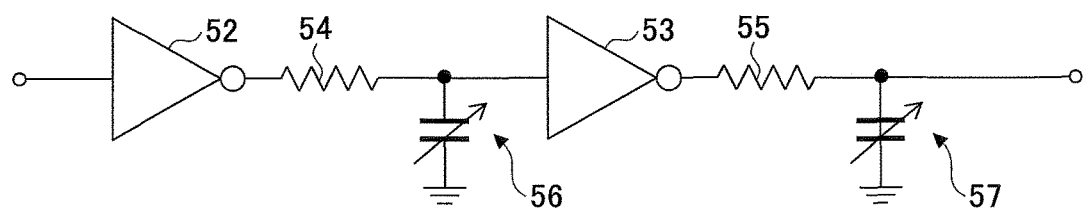
FIG. 8 illustrates an example configuration of the variable delay circuit.

FIG. 8 illustrates an example configuration of the variable delay circuit. The variable delay circuit of FIG. 8 may be used in the phase comparator 21 of FIG. 2. The variable delay circuit of FIG. 8 includes inverters 52 and 53, resistor elements 54 and 55, and capacitor elements 56 and 57. The inverter 52 generates an output signal which is logically inverted from the input signal and presents the output signal from the output terminal thereof. Depending on the voltage of the output signal, a current flows through the resistor element 54 and the capacitor element 56, so that the capacitor element 56 is charged or discharged. Based on the charged or discharged operation of the capacitor element 56, the input signal voltage of the of the inverter 53 varies, so that, when the input signal voltage of the of the inverter 53 exceeds a threshold voltage of the inverter 53, the output signal voltage of the inverter 53 changes. Based on the change of the output signal voltage of the inverter 53, similarly, the capacitor element 57 is charged or discharged. The rate (speed) of changing the voltage between the terminals of the capacitor element is determined based on the resistance value "R" of the resistor element and the capacitance value "C" of the capacitor element. Based on the rate (speed) of changing the voltage between the terminals of the capacitor element, the delay, time which is necessary to transmit the signal from the input terminal to the output terminal of the variable delay circuit, is determined.

In the configuration of the variable delay circuit of FIG. 8, a variable capacitance element (varactor) is used as the capacitor elements 56 and 57. By changing the varactor control voltage which is applied to the control terminals of the capacitor elements 56 and 57, the capacitance values of the capacitor elements 56 and 57 can be changed. By doing this, a desired delay time can be obtained.

Figure 9:
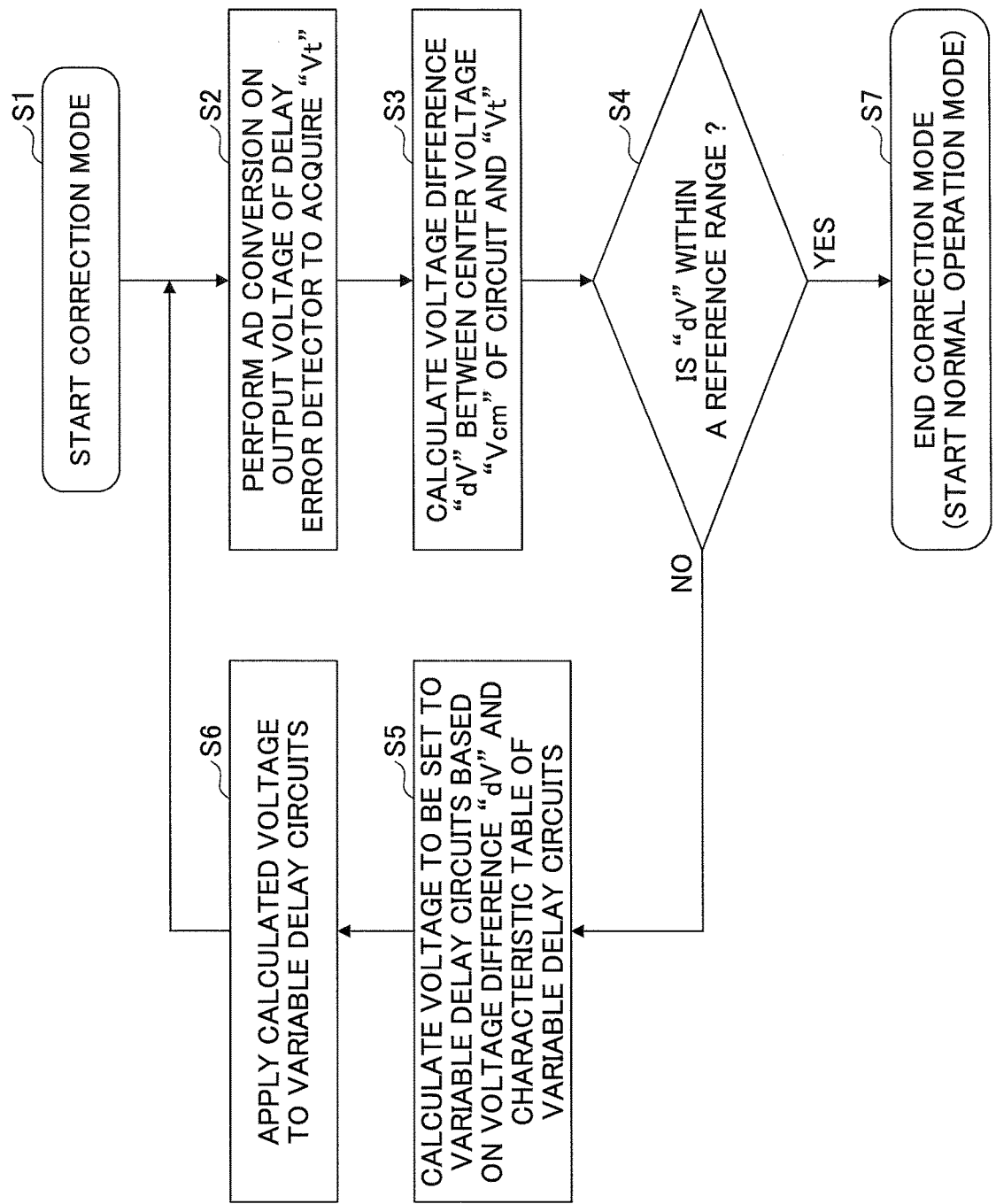
FIG. 9 is a flowchart of an example procedure of operation control of the PLL circuit of FIG. 2.

FIG. 9 is a flowchart of an example procedure of the operation control of the PLL circuit of FIG. 2. Note that the execution order of steps described in the flowchart is an example only, and a technical scope of the present application is not limited thereto. For example, even when the description of the present invention recites that step "B" is executed after step "A", it is not only that step "B" can be executed after step "A", but also that step "A" may be physically or theoretically executed after step "B". In this case, if all the results which influence the processes of the flowchart are the same regardless of the execution order of steps "A" and "B", it is obvious that step "A" may be executed after step "B" in view of disclosing the technique of the present application. That is, even in a case where the description of the present application explains that step "B" is executed after step "A", which is not intended to exclude the obvious case as described above from the scope of the present application, so that when it is obvious as described above, it is to be understood that the case is also included in the technical scope of the present application.

In step S1, a correction mode starts. That is, in the PLL circuit of FIG. 2, the operation of the correction mode starts which adjusts the delay time of the variable delay circuits 31-1 through 31-3. Specifically, the oscillation signal of the PLL circuit is set to a mode in which the oscillation signal is not used in any other circuits, and the operations of the delay error detector 25, the AD converter 26, the signal processor 27, and the DA converter 28 are started.

In step S2, the AD converter 26 performs AD conversion on the output voltage of the delay error detector 25, and the acquired digital voltage is referred to "Vt". In step S3, the signal processor 27 calculates a voltage difference "dv" which is between the center voltage "Vcm" (the intermediate (average) voltage between HIGH voltage and LOW voltage) and the voltage "Vt". When it is determined that the voltage difference "dv" is less than or equal to (within) a predetermined reference value (YES in step 4), the process goes to step S7 so that the correction mode ends. As a result of ending the correction mode, the usual oscillation and the phase follow-up operation in the PLL circuit may be started, so that a mode is set in which the oscillation signal of the PLL circuit can be used in any other circuit. Further, the operations of the delay error detector 25, the AD converter 26, the signal processor 27, and the DA converter 28 may be stopped.

When it is determined that the voltage difference "dv" exceeds the predetermined reference value (NO in step 4), the process goes to step S5. In step S5, the signal processor 27 reads the digital voltage value, which corresponds to the voltage difference "dv", from a characteristic table of the variable delay circuits. Based on the digital voltage value, the voltage value to be applied to the variable delay circuits 31-1 through 31-3 is calculated. In step S6, the DA converter 28 converts the digital voltage value, which is calculated by the signal processor 27, into an analog voltage, so that the analog voltage is applied to the variable delay circuits 31-1 through 31-3.

Figure 10:
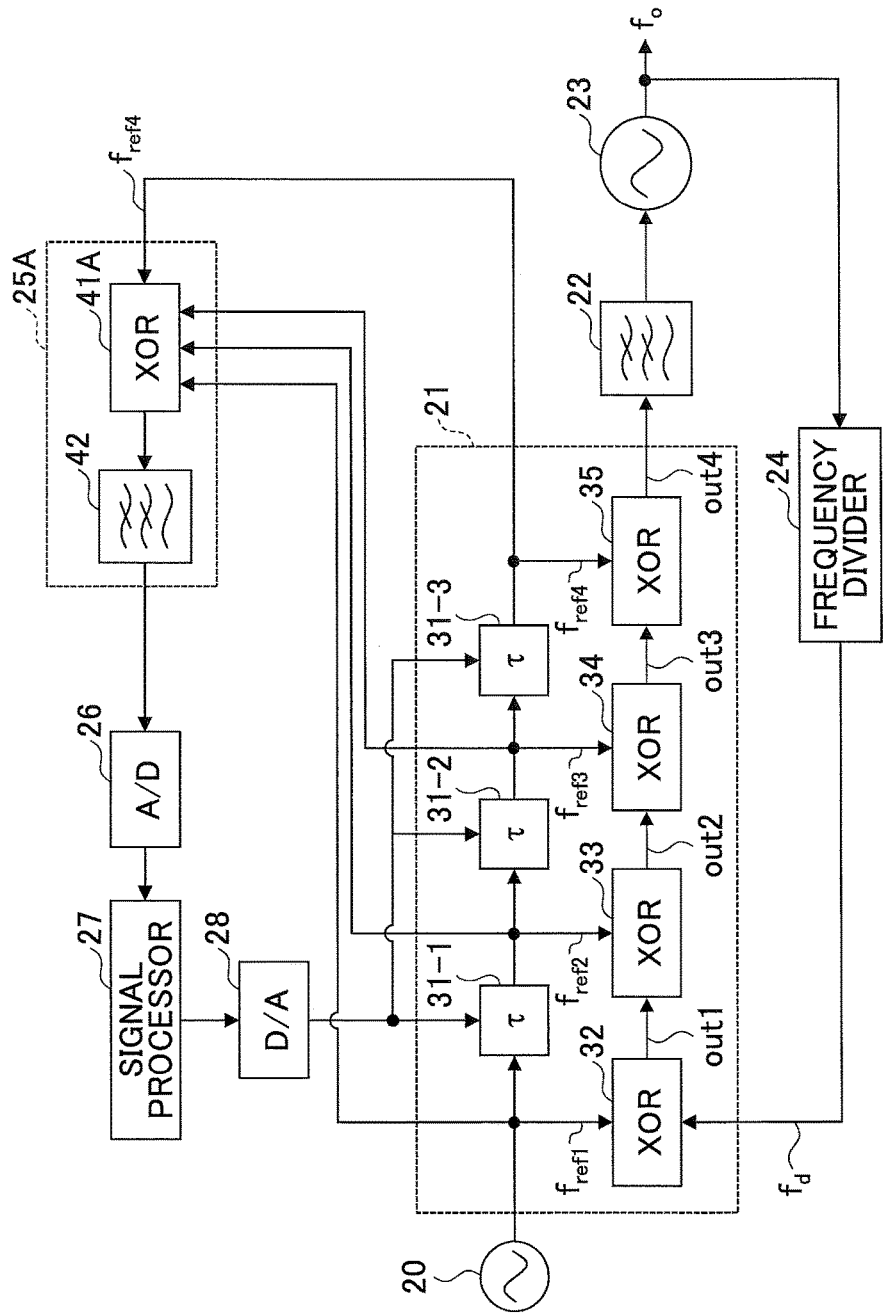
FIG. 10 illustrates another example of the configuration of a PLL circuit according to an embodiment.

FIG. 10 illustrates another example of the configuration of the PLL circuit according to an embodiment. In FIG. 10, the same reference numerals are used to describe the same or corresponding elements described in FIG. 2, and the repeated descriptions thereof are herein omitted.

In the PLL circuit of FIG. 10, a delay error detector 25A is provided in place of the delay error detector 25 of the PLL circuit in FIG. 2. The delay error detector 25A includes a four-input XOR circuit 41A and the low path filter 42. The delay error detector 25A, the AD converter 26, the signal processor 27, and the DA converter 28 function as a control circuit to adjust the delay time of the variable delay circuits 31-1 through 31-3 to be equal to T/2M based on the XOR result between at least two reference signals among M reference signals. In the example of FIG. 10, the four-input XOR circuit 41A calculates the XOR result between the M (4 in this example) reference signals.

The logical operation, which is performed by the four-input XOR circuit 41A of the delay error detector 25A in FIG. 10, is equivalent to the logical operation performed by the two-input XOR circuit 41 of the delay error detector 25 in FIG. 2. Therefore, the PLL circuit of FIG. 10 operates similar to the PLL circuit of FIG. 2.

Figure 11:
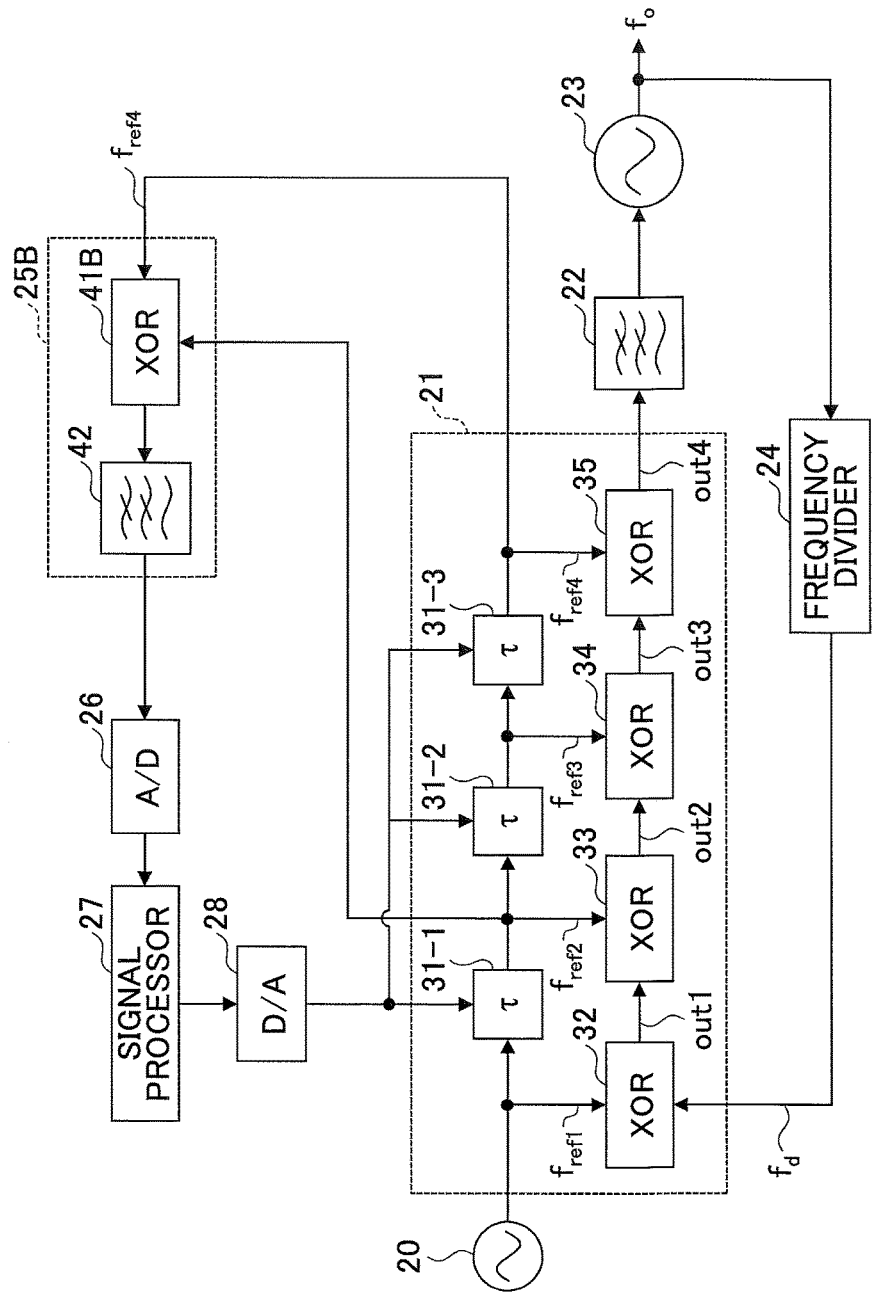
FIG. 11 illustrates still another example of the configuration of a PLL circuit according to an embodiment.

FIG. 11 illustrates still another example of the configuration of the PLL circuit according to an embodiment. In FIG. 11, the same reference numerals are used to describe the same or corresponding elements described in FIG. 2, and the repeated descriptions thereof are herein omitted.

In the PLL circuit of FIG. 11, a delay error detector 25B is provided in place of the delay error detector 25 of the PLL circuit in FIG. 2. The delay error detector 25B includes a two-input XOR circuit 41B and the low path filter 42. The delay error detector 25B, the AD converter 26, the signal processor 27, and the DA converter 28 function as a control circuit to adjust the delay time of the variable delay circuits 31-1 through 31-3 to be equal to T/2M based on the XOR result between at least two reference signals among M reference signals. In the example of FIG. 11, the two-input XOR circuit 41B calculates the XOR result between the two reference signals.

Especially, the two-input XOR circuit 41B calculates the XOR result between two reference signals which are ideally shifted from each other by T/M (T/4 in this example). The XOR result between two reference signals which are ideally shifted from each other by T/4 is indicated as a pulse signal having a cycle of T/2 and a duty ratio of 50%. When the time difference between the two reference signals becomes longer than the ideal value, the pulse width of the pulse signal of the XOR result becomes longer. On the other hand, when the time difference between the two reference signals becomes shorter than the ideal value, the pulse width of the pulse signal of the XOR result becomes shorter. Therefore, similar to the case of the delay error detector 25 of FIG. 2, by performing the feedback control on the delay time of the variable delay circuits 31-1 through 31-3 based on the output voltage of the delay error detector 25B, it becomes possible to set an appropriate delay time to the variable delay circuits 31-1 through 31-3.

When compared with the calculation of the XOR result of four reference signals, in a case where the XOR result is calculated between two reference signals, a range of the delay time where the pulse width is monotonically increased is extended with the increase of the delay time. Therefore, in the PLL circuit of FIG. 11, it becomes possible to properly converge the delay time of the variable delay circuits 31-1 through 31-3 to a desired value relative to the delay time in a wider range.

Figure 12:
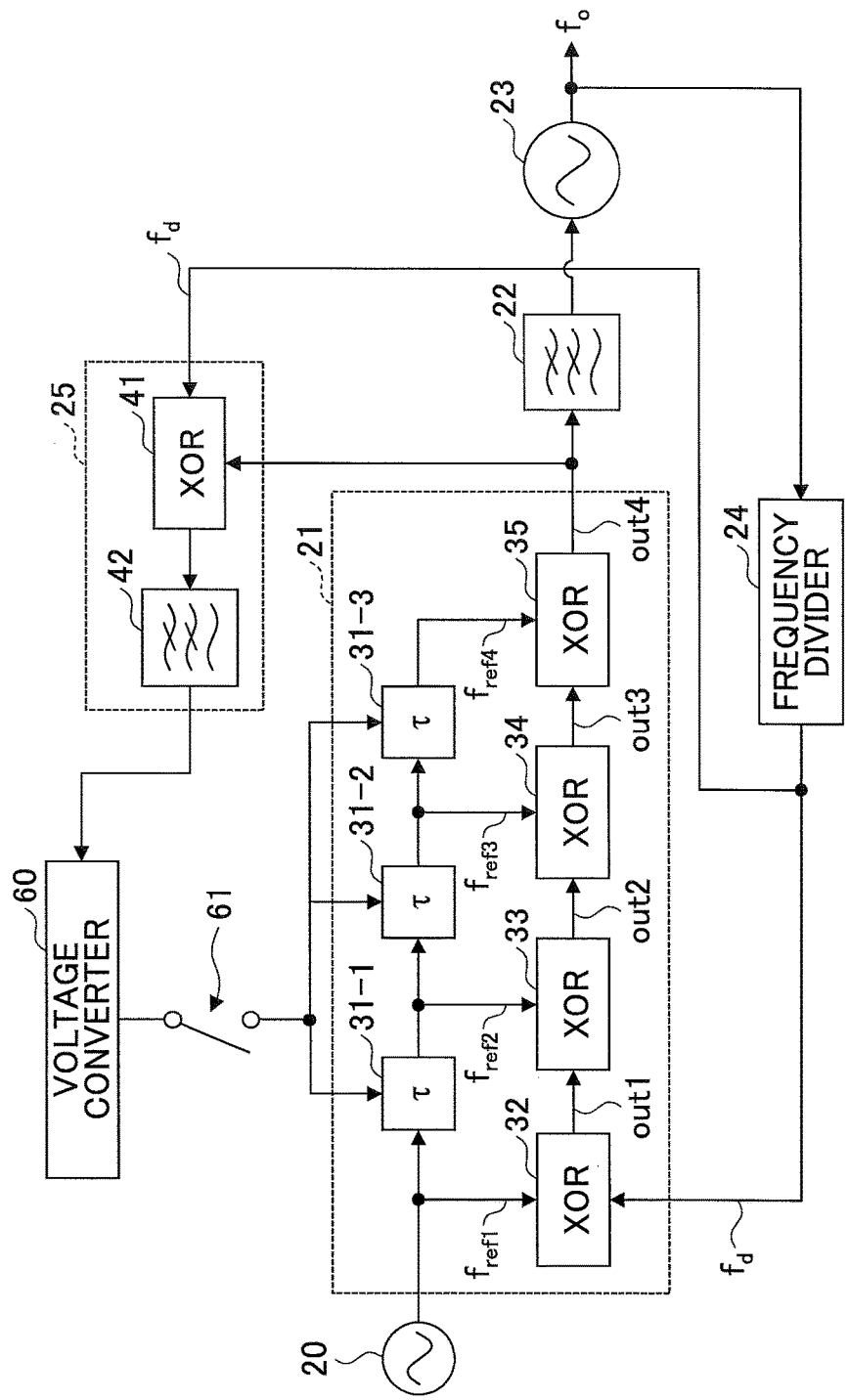
FIG. 12 illustrates still another example of the configuration of a PLL circuit according to an embodiment.

FIG. 12 illustrates still another example of the configuration of the PLL circuit according to an embodiment. In FIG. 12, the same reference numerals are used to describe the same or corresponding elements described in FIG. 2, and the repeated descriptions thereof are herein omitted.

In the PLL circuit of FIG. 12, a voltage converter 60 and a switcher 61 are provided in place of the AD converter 26, the signal processor 27, and the DA converter 28. In the PLL circuits described above, the output analog voltage of the delay error detector is converted into the digital value, and the digital conversion is performed from the output voltage of the delay error detector into the voltage to be applied to the variable delay circuits in a digital region. In the PLL circuit of FIG. 12, on the other hand, the voltage converter 60 converts the output voltage of the delay error detector into the voltage to be applied to the variable delay circuits in an analog region directly. The switcher 61 is provided to control whether the output of the voltage converter 60 is applied to the variable delay circuits 31-1 through 31-3.

Figure 13:
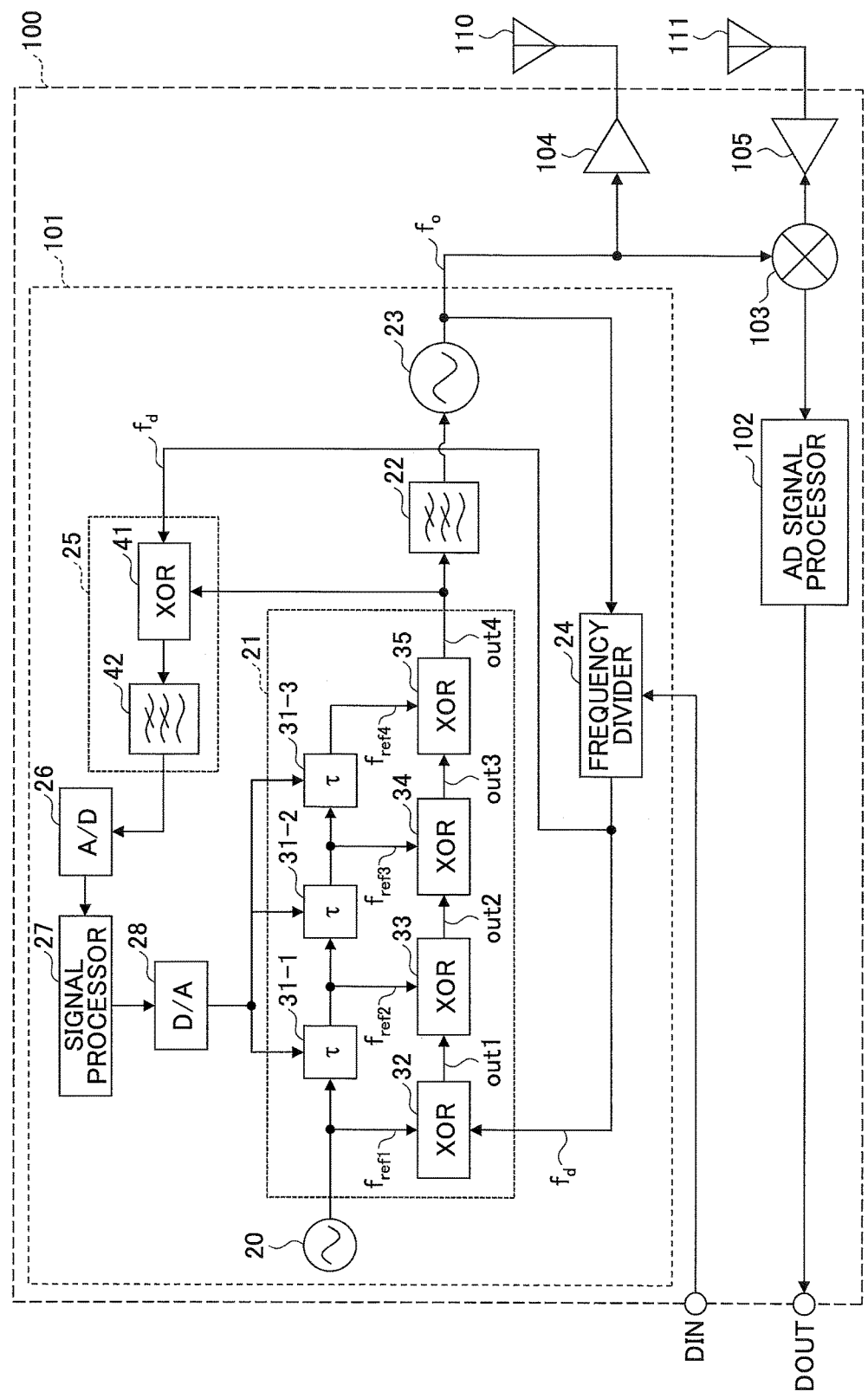
FIG. 13 illustrates an example configuration of a transceiver according to an embodiment.

FIG. 13 is an example configuration of a transceiver 100 according to an embodiment. In FIG. 13, the same reference numerals are used to describe the same or corresponding elements described in FIG. 2, and the repeated descriptions thereof are herein omitted.

The transceiver 100 of FIG. 13 includes a PLL circuit 101, an AD signal processor 102, a mixer 103, and amplifiers 104 and 105. The frequency division ratio of the frequency divider 24 in the PLL circuit 101 is variable, and is set in accordance with the value of the input data "DIN". By having this configuration, the PLL circuit 101 generates an oscillation signal having a frequency corresponding to the value of the input data "DIN". The oscillation signal generated by the PLL circuit 101 is amplified by the amplifier 104 and transmitted from the transmission antenna 110 as radio waves.

The received signal based on the radio waves received by the receiving antenna 111 is amplified by the amplifier 105, and is input in the mixer 103. The mixer 103 mixes the oscillation signal generated by the PLL circuit 101 with the received signal to generate a beat signal. The generated beat signal is converted into digital values and appropriate signal processing is performed on the digital values by the AD signal processor 102, so that the processed signal is supplied externally as the data "DOUT".

In this example, the PLL circuit having the configuration of FIG. 2 is used as the PLL circuit 101. In place of the PLL circuit of FIG. 2, a PLL circuit having a configuration of FIG. 10, 11, or 12 may be used.

Figure 14:
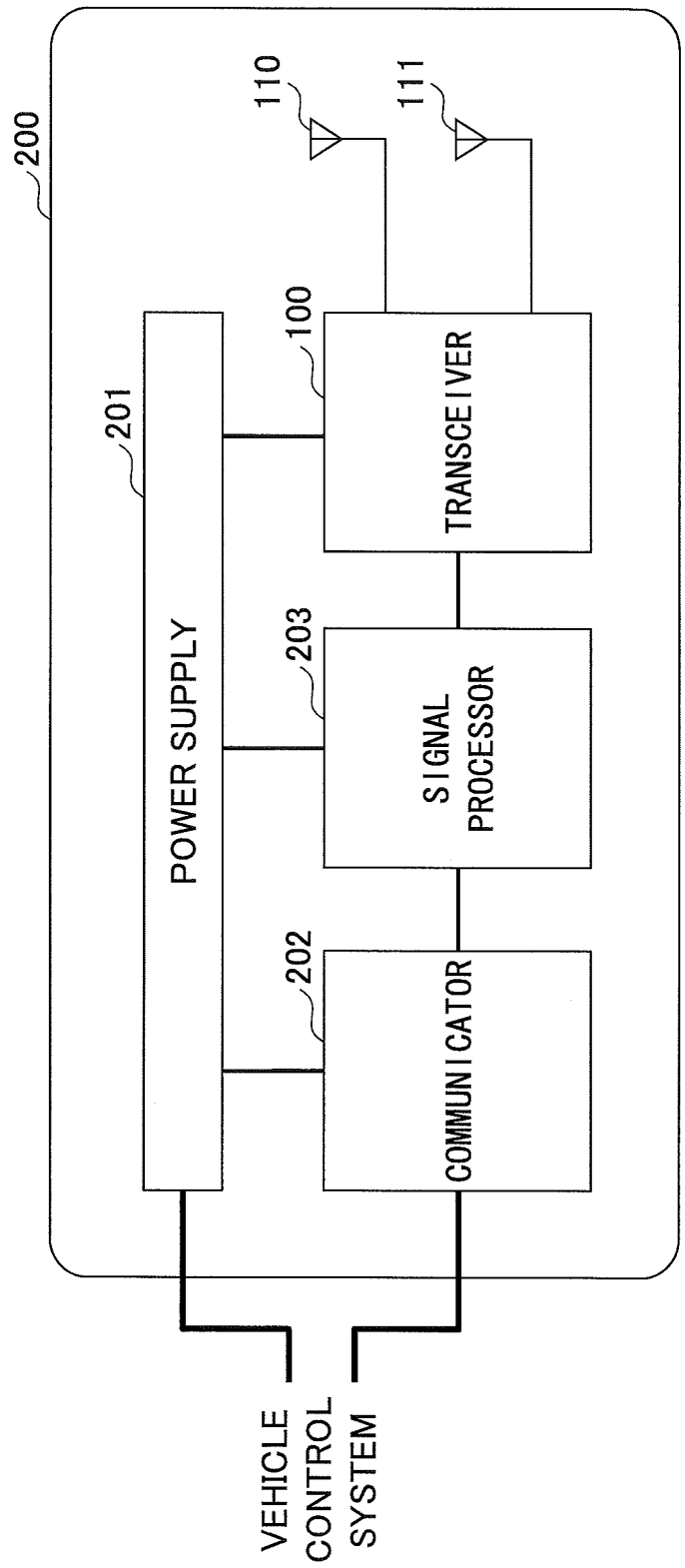
FIG. 14 illustrates an example configuration of an in-vehicle radar system according to an embodiment.

FIG. 14 illustrates an example configuration of an in-vehicle radar system 200 according to an embodiment. The in-vehicle radar system 200 of FIG. 14 includes a power supply 201, a communicator 202, a signal processor 203, a transceiver 100, a transmission antenna 110, and a receiving antenna 111. The power supply 201 supplies power voltages to the communicator 202, the signal processor 203, and the transceiver 100. The communicator 202 is a circuit to communicate with a vehicle control system. The signal processor 203 performs, for example, calculations to obtain a distance to and a speed relative to an object, and controls the operations of the transceiver 100 and the communicator 202.

As the transceiver 100 of FIG. 14, the transceiver 100 of FIG. 13 may be used. For example, in a Frequency Modulation Continuous Wave (FMCW) radar apparatus, it is possible to obtain a distance to and a speed relative to an object by transmitting triangular-wave frequency-modulated millimeter radio waves and calculating based on the frequency difference between the transmission signal and a receiving signal, etc. In this case, the transmission signal from the transceiver 100 is transmitted from the transmission antenna 110 as the millimeter radio waves, and the millimeter radio waves reflected by the object are received by the receiving antenna 111, so that the received signal is supplied to the transceiver 100. The beat signal extracted from the received signal by the transceiver 100 is supplied to the signal processor 203, so that the frequency component of the beat signal is detected by performing signal processing by the signal processor 203, and the distance to and the speed relative to the object are obtained. Note that the operations of the steps in the flowchart of FIG. 9 may be executed under the control of the signal processor 203.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiments of the present inventions have been described in detail, it is to be understood that various changes, substitutions, and alterations could be made hereto without departing from the spirit and scope of the invention.

What is claimed is:
1. A PLL circuit comprising:
a frequency divider configured to divide an oscillation signal to generate a divided signal having a cycle of T/M (M: an integer greater than one);

a phase comparator configured to generate M reference signals by sequentially delaying a reference signal having a cycle of T one after another by a predetermined delay time and generate an Exclusive OR calculation result of the M reference signals and the divided signal;
a loop filter configured to generate a voltage signal based on the Exclusive OR calculation result input thereto;
a voltage-controlled oscillator configured to generate the oscillation signal by oscillating at a frequency in accordance with the voltage signal; and
a control circuit configured to adjust the predetermined delay time to be equal to T/2M based on an Exclusive OR calculation result of at least two of the M reference signals.

2. The PLL circuit according to claim 1,
wherein the phase comparator includes
  M two-input Exclusive OR circuits connected in series, and
wherein, among the M two-input Exclusive OR circuits, a first-stage two-input Exclusive OR circuit calculates an Exclusive OR calculation result of two signals selected from a group consisting of the M reference signals and the divided signal, and each of the M two-input Exclusive OR circuits excluding the first-stage two-input Exclusive OR circuit calculates an Exclusive OR calculation result of one signal selected from the group consisting of the M reference signals and the divided signal and an output of a previous-stage two-input Exclusive OR circuit.

3. The PLL circuit according to claim 1,
wherein the control circuit includes
  an Exclusive OR circuit configured to calculate an Exclusive OR calculation result of at least two of the M reference signals,
  a low path filter configured to smooth an output of the Exclusive OR circuit having calculated the Exclusive OR calculation result of at least two of the M reference signals; and
  a voltage application circuit configured to apply a voltage, which corresponds to an output voltage of the low path filter, to adjust the predetermined delay time.

4. The PLL circuit according to claim 1,
wherein the control circuit is configured to adjust the predetermined delay time to be equal to T/2M based on an Exclusive OR calculation result of the Exclusive OR calculation result generated by the phase comparator and the divided signal.

5. The PLL circuit according to claim 1,
wherein the control circuit is configured to adjust the predetermined delay time to be equal to T/2M based on an Exclusive OR calculation result of the M reference signals.

6. The PLL circuit according to claim 1,
wherein the control circuit is configured to adjust the predetermined delay time to be equal to T/2M based on an Exclusive OR calculation result of two of the M reference signals.

7. A method of controlling a PLL circuit, comprising:
generating M reference signals (M: an integer greater than one) by sequentially delaying a reference signal having a cycle of T one after another by a predetermined delay time;
generating a divided signal having a cycle of T/M by dividing an oscillation signal of a voltage-controlled oscillator;
generating a phase comparison result which is an Exclusive OR calculation result of the M reference signals and the divided signal;
generating the oscillation signal so as to oscillate at a frequency in accordance with the phase comparison result; and
adjusting the predetermined delay time to be equal to T/2M based on an Exclusive OR calculation result of at least two of the M reference signals.

8. An electronic apparatus comprising:
a PLL circuit including a frequency divider that can control and change a division ratio;
a mixer configured to receive a receiving signal from a receiving antenna and an oscillation signal of the PLL circuit as inputs thereof; and
an AD converter configured to convert an output signal of the mixer into a digital signal and perform processing on the digital signal,
wherein the PLL circuit includes
  a frequency divider configured to divide an oscillation signal to generate a divided signal having a cycle of T/M (M: an integer greater than one);
  a phase comparator configured to generate M reference signals by sequentially delaying a reference signal having a cycle of T one after another by a predetermined delay time and generate an Exclusive OR calculation result of the M reference signals and the divided signal;
  a loop filter configured to generate a voltage signal based on the Exclusive OR calculation result input thereto;
  a voltage-controlled oscillator configured to generate the oscillation signal by oscillating at a frequency in accordance with the voltage signal; and
  a control circuit configured to adjust the predetermined delay time to be equal to T/2M based on an Exclusive OR calculation result of at least two of the M reference signals.

9. The PLL circuit as claimed in claim 1, wherein the phase comparator is configured to generate the Exclusive OR calculation result that is obtained by calculating an exclusive logical OR of M+1 input signals that include the M reference signals and the divided signal.

10. The PLL circuit as claimed in claim 1, wherein each of the M reference signals is a periodic signal having a cycle of T.

11. The PLL circuit as claimed in claim 1, wherein the phase comparator is configured to generate a phase comparison result, the phase comparison result being the Exclusive OR calculation result.

* * * * *